US012813349B2

(12) United States Patent
Baik et al.

(10) Patent No.: US 12,813,349 B2
(45) Date of Patent: Nov. 24, 2026

(54) SEMICONDUCTOR PACKAGE

(71) Applicant: SAMSUNG ELECTRONICS CO., LTD., Suwon-si (KR)

(72) Inventors: Seung Hyun Baik, Suwon-si (KR); Won Hee Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 18/524,135

(22) Filed: Nov. 30, 2023

(65) Prior Publication Data

US 2024/0203940 A1 Jun. 20, 2024

(30) Foreign Application Priority Data

Dec. 19, 2022 (KR) ........................ 10-2022-0177942

(51) Int. Cl.
*H10W 90/00* (2026.01)
*H10W 72/00* (2026.01)
(Continued)

(52) U.S. Cl.
CPC .......... *H10W 90/00* (2026.01); *H10W 74/111* (2026.01); *H10W 76/40* (2026.01);
(Continued)

(58) Field of Classification Search
CPC . H10W 90/00; H10W 90/732; H10W 90/754; H10W 90/752; H10W 90/734;
(Continued)

(56) References Cited

U.S. PATENT DOCUMENTS

| | | | |
|---|---|---|---|
| 7,445,963 | B2 | 11/2008 | Ho et al. |
| 10,510,724 | B2 | 12/2019 | Yoo et al. |

(Continued)

FOREIGN PATENT DOCUMENTS

| | | |
|---|---|---|
| EP | 0714773 B1 | 10/1999 |
| KR | 10-2013-0036591 | 4/2013 |
| KR | 10-2020-0073950 | 6/2020 |

OTHER PUBLICATIONS

Office Action dated Apr. 29, 2026 issued in the corresponding Korean Patent Application No. 10-2022-0177942. (Note: US2021/0249373A, US2020/0075543A, and US2021/0013136A already submitted.)

*Primary Examiner* — Wael M Fahmy
*Assistant Examiner* — Thomas Wilson Mccoy
(74) *Attorney, Agent, or Firm* — MORGAN, LEWIS & BOCKIUS LLP

(57) ABSTRACT

A semiconductor package includes: a substrate extending in first and second directions that intersect each other; a first semiconductor chip stack disposed on the substrate and including a plurality of first semiconductor chips stacked on each other, a second semiconductor chip stack disposed on the substrate, and spaced apart from the first semiconductor chip stack in the first direction, wherein the second semiconductor chip stack includes a plurality of second semiconductor chips stacked on each other, a first spacer disposed on the first semiconductor chip stack and including a coupling layer; and a mold layer covering the first and second semiconductor chip stacks and in contact with the first spacer.

20 Claims, 17 Drawing Sheets

(51) Int. Cl.
*H10W 74/10* (2026.01)
*H10W 76/40* (2026.01)

(52) U.S. Cl.
CPC ........ *H10W 72/865* (2026.01); *H10W 72/884* (2026.01); *H10W 90/732* (2026.01); *H10W 90/734* (2026.01); *H10W 90/752* (2026.01); *H10W 90/754* (2026.01)

(58) Field of Classification Search
CPC . H10W 90/231; H10W 90/24; H10W 90/291; H10W 76/40; H10W 74/111; H10W 74/10; H10W 72/00; C01B 33/04–046; C01B 33/107–10794
See application file for complete search history.

(56) References Cited

U.S. PATENT DOCUMENTS

| | | | | |
|---|---|---|---|---|
| 11,373,982 | B2 | 6/2022 | Yamashita | |
| 2011/0084411 | A1 | 4/2011 | Eu et al. | |
| 2016/0351739 | A1* | 12/2016 | Clara | H10F 77/143 |
| 2020/0075543 | A1* | 3/2020 | Kosaka | H01L 25/0652 |
| 2021/0013136 | A1* | 1/2021 | Cho | H01L 23/4334 |
| 2021/0249373 | A1* | 8/2021 | Niwa | H01L 25/50 |
| 2022/0165678 | A1 | 5/2022 | Kim | |
| 2022/0271007 | A1 | 8/2022 | Tai et al. | |
| 2024/0072022 | A1* | 2/2024 | Ye | H01L 25/18 |
| 2024/0072024 | A1* | 2/2024 | Boo | H01L 25/18 |

* cited by examiner

SEMICONDUCTOR PACKAGE

CROSS-REFERENCE TO RELATED APPLICATION

This application claims priority under 35 USC § 119 to Korean Patent Application No. 10-2022-0177942 filed on Dec. 19, 2022 in the Korean Intellectual Property Office, the disclosure of which is incorporated by reference herein in its entirety.

TECHNICAL FIELD

The present inventive concept relates to a semiconductor package.

DISCUSSION OF THE RELATED ART

According to the recent trend of miniaturization and weight reduction of electronic components, a reduction in a size of semiconductor packages that are mounted on the electronic components is desired. While an area of a package is limited, the size and number of semiconductor chips included in the package are increasing. Accordingly, there is a desire to efficiently dispose the semiconductor chips within the limited area of the package.

In addition, in disposing a chip stack, in which a plurality of semiconductor chips are stacked, on the package, an interface separation between the chip stack and an epoxy molding compound (EMC) layer may form.

SUMMARY

According to an exemplary embodiment of the present inventive concept, a semiconductor package includes: a substrate extending in first and second directions that intersect each other; a first semiconductor chip stack disposed on the substrate and including a plurality of first semiconductor chips stacked on each other; a second semiconductor chip stack disposed on the substrate, and spaced apart from the first semiconductor chip stack in the first direction, wherein the second semiconductor chip stack includes a plurality of second semiconductor chips stacked on each other, a first spacer disposed on the first semiconductor chip stack and including a coupling layer; and a mold layer covering the first and second semiconductor chip stacks and in contact with the first spacer.

According to an exemplary embodiment of the present inventive concept, a semiconductor package includes: a substrate including a first area and a second area spaced apart from the first area; a first semiconductor chip stack disposed in the first area and including a plurality of first semiconductor chips stacked on each other; a second semiconductor chip stack disposed in the second area and including a plurality of second semiconductor chips stacked on each other; a first spacer disposed on the first semiconductor chip stack in the first area and including a silicon layer and a coupling layer disposed on the silicon layer; and a mold layer in contact with a first surface of the first spacer and a first surface of the second semiconductor chip stack.

According to an exemplary embodiment of the present inventive concept, a semiconductor package includes: a substrate extending in first and second directions that intersect each other, a first semiconductor chip stack disposed on the substrate and including a plurality of first semiconductor chips stacked on each other; a second semiconductor chip stack disposed on the substrate, and spaced apart from the first semiconductor chip stack in the first direction, wherein the second semiconductor chip stack includes a plurality of second semiconductor chips stacked on each other; a first spacer disposed on the first semiconductor chip stack and having a silane coupling agent; a mold layer covering the first and second semiconductor chip stacks; a controller disposed between the substrate and the second semiconductor chip stack; and a second spacer disposed between the controller and the second semiconductor chip stack.

BRIEF DESCRIPTION OF THE DRAWINGS

The above and features of the present inventive concept will become more apparent by describing in detail exemplary embodiments thereof with reference to the attached drawings, in which.

DETAILED DESCRIPTION OF THE EMBODIMENTS

Figure 1:
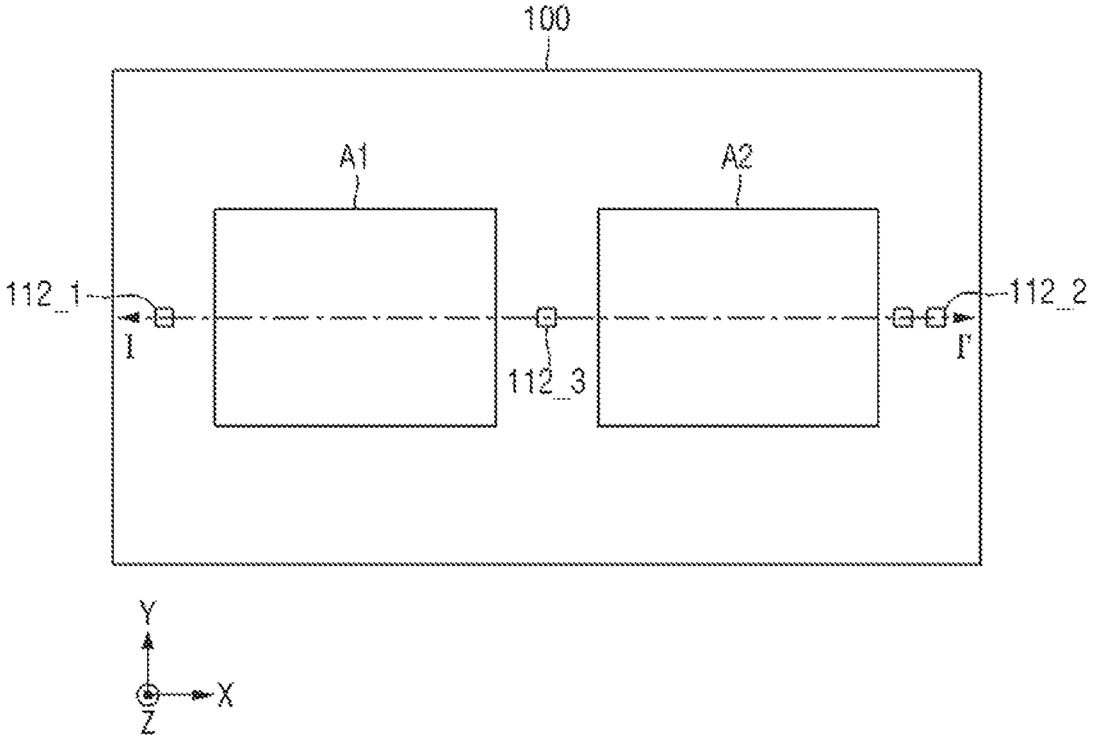
FIG. 1 is a plan view illustrating a semiconductor package according to an exemplary embodiment of the present inventive concept.

Hereinafter, exemplary embodiments of the present inventive concept will be described in detail with reference to the accompanying drawings. The same reference numerals are used for the same components in the drawings and specification, and duplicate descriptions thereof may be omitted or briefly discussed.

Hereinafter, a semiconductor package according to an exemplary embodiment of the present inventive concept will be described with reference to FIGS. 1 to 11.

Figure 2:
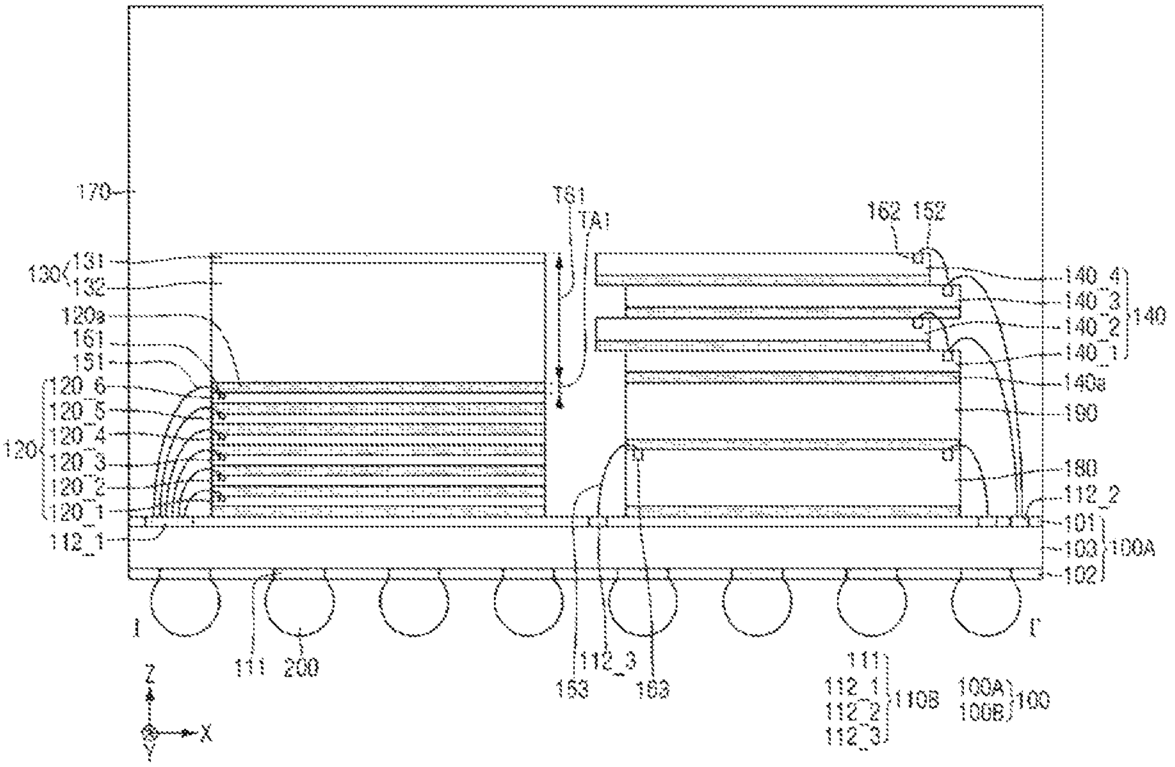
FIG. 2 is a cross-sectional view taken along line I-I' of FIG. 1.

FIG. 1 is a plan view illustrating a semiconductor package according to an exemplary embodiment of the present inventive concept. FIG. 2 is a cross-sectional view taken along line I-I' of FIG. 1.

Referring to FIGS. 1 and 2, a semiconductor package 1000A according to an exemplary embodiment of the present inventive concept may include a substrate 100, a first semiconductor chip stack 120, a second semiconductor chip stack 140, a first spacer 130, and a mold layer 170, and may further include a controller 180 and a second spacer 190.

The substrate 100 may be a substrate for a semiconductor package. The substrate 100 may be, for example, a printed circuit board (PCB), a lead frame (LF), a ceramic substrate, a silicon wafer, or a wiring board. The printed circuit board may include, for example, a rigid printed circuit board (PCB), a flexible printed circuit board (PCB), or a rigid flexible printed circuit board (PCB).

Referring to FIG. 1, the substrate 100 may extend in a first direction X and a second direction Y, respectively. The first direction X and the second direction Y may refer to directions that are parallel to an upper surface of the substrate 100 and intersect each other A third direction Z may refer to a direction that intersects the first direction X and the second direction Y, respectively, and is substantially perpendicular to the upper surface of the substrate 100.

The substrate 100 may include a first area A1 and a second area A2 spaced apart from the first area A1 in the first direction X in plan view. The first area A1 may be an area where a first semiconductor chip stack 120 to be described later is disposed, and the second area A2 may be an area where a second semiconductor chip stack 140 to be described later is disposed.

The substrate 100 may include an insulating structure 100A and a wiring structure 100B.

The insulating structure 100A may include an upper passivation layer 101, a lower passivation layer 102, and an insulating layer 103. The insulating layer 103 may be disposed between the upper passivation layer 101 and the lower passivation layer 102. The upper passivation layer 101 and the lower passivation layer 102 may be respectively disposed on upper and lower surfaces of the insulating layer 103.

The upper passivation layer 101 and the lower passivation layer 102 may include an organic material such as a photosensitive polymer. The photosensitive polymer may include, for example, at least one of photosensitive polyimide, polybenzoxazole, phenol-based polymer, and/or benzocyclobutene-based polymer. The upper passivation layer 101 and the lower passivation layer 102 may include, for example, a photo imageable dielectric material, but the present inventive concept is not limited thereto.

The wiring structure 100B may be disposed within the insulating structure 100A. The wiring structure 100B may include a lower wiring pad 111 and an upper wiring pad 112. A plurality of wiring pads and vias electrically connecting the lower wiring pad 111 and the upper wiring pad 112 to each other may be formed in the insulating layer 103.

The upper wiring pad 112 may include a first upper pad 112_1, a second upper pad 112_2, and a third upper pad 112_3 within the upper passivation layer 101. For example, the first upper pad 112_1, the second upper pad 112_2, and the third upper pad 112_3 may form a first wiring layer. The lower wiring pad 111 may be disposed within the lower passivation layer 102. For example, the lower wiring pad 111 may form a second wiring layer.

The first upper pad 112_1 may electrically connect a first_first semiconductor chip stack 120_1 and the substrate 100 to each other. For example, the first upper pad 112_1 may be connected to a first semiconductor chip pad 161 of the first_first semiconductor chip stack 120_1 through a first connection portion 151. For example, the first connection portion 151 may be a bonding wire.

The second upper pad 112_2 may electrically connect a second semiconductor chip stack 140 and the substrate 100 to each other. For example, the second upper pad 112_2 may be connected to a second semiconductor chip pad 162 of the second semiconductor chip stack 140 through a second connection portion 152. For example, the second connection portion 152 may be a bonding wire.

The third upper pad 112_3 may electrically connect a controller 180, which is to be described later, and the substrate 100 to each other. For example, the third upper pad 112_3 may be connected to a controller chip pad 163 of the controller 180 through a third connection portion 153. For example, the third connection portion 153 may be a bonding wire. In this case, the controller 180 may be mounted on the substrate 100 by a wire bonding method.

The lower wiring pad 111 may be disposed on a lower side of the insulating layer 103. The lower wiring pad 111 may be electrically connected to an external connection terminal 200. The lower wiring pad 111 may electrically connect the external connection terminal 200 and the substrate 100 to each other.

Although it is shown in the drawing that the first upper pad 112_1, the second upper pad 112_2, the third upper pad 112_3, and the lower wiring pad 111 are formed with a specific number, respectively, the present inventive concept is not limited thereto. For example, the first upper pad 112_1, the second upper pad 112_2, the third upper pad 112_3, and the lower wiring pad 111 may each be formed in numbers different from those illustrated.

The first upper pad 112_1, the second upper pad 112_2, the third upper pad 112_3, and the lower wiring pad 111 may each include a conductive material. The first upper pad 112_1, the second upper pad 112_2, the third upper pad 112_3, and the lower wiring pad 111 may include, for example, gold (Au), silver (Ag), copper (Cu), nickel (Ni), and/or aluminum (Al).

The first and second semiconductor chip stacks 120 and 140 may be disposed to be spaced apart from each other on the substrate 100. For example, the second semiconductor chip stack 140 may be spaced apart from the first semiconductor chip stack 120 in the first direction X. In an exemplary embodiment of the present inventive concept, the second semiconductor chip stack 140 may be spaced apart from the first semiconductor chip stack 120 in the second direction Y.

The first semiconductor chip stack 120 may include a plurality of semiconductor chips 120_1 to 120_6. For example, the first semiconductor chip stack 120 may have a form in which the plurality of semiconductor chips (e.g., 120_1 to 120_6) are stacked in the third direction Z.

The semiconductor chips 120_1 to 120_6 may include memory chips. Each of the semiconductor chips 120_1 to 120_6 may include, for example, a volatile memory chip such as DRAM.

The first semiconductor chip pad 161 may be disposed on each of the semiconductor chips 120_1 to 120_6. For example, the first semiconductor chip pad 161 may be disposed on an upper surface of each of the semiconductor chips 120_1 to 120_6. For example, the first semiconductor chip pad 161 may be exposed on one corner (e.g., a left corner) of the upper surface of each of the semiconductor chips 120_1 to 120_6. A plurality of first semiconductor chip pads 161 may be formed.

The first semiconductor chip pad 161 may include, for example, at least one of copper (Cu), aluminum (Al), tungsten (W), and/or titanium (Ti).

In an exemplary embodiment of the present inventive concept, the first semiconductor chip pad 161 may protrude upward from each of the semiconductor chips 120_1 to 120_6. However, the present inventive concept is not limited thereto, and for example, a via may be formed instead of the first semiconductor chip pad 161. In this case, the semiconductor chips 120_1 to 120_6 and the substrate 100 may be electrically connected to each other through the via. For example, the via may extend through the semiconductor chips 120_1 to 120_6 to the substrate 100.

A first adhesive layer **120*a* may be disposed between the respective semiconductor chips 120_1 to 120_6, between the lowermost semiconductor chip 120_1 and the substrate 100, and between a first spacer 130, which is to be described later, and the uppermost semiconductor chip 120_6**.

The first adhesive layer **120*a* may be, for example, a direct adhesive film (DAF). The first adhesive layer 120*a* may include, for example, an insulating polymer. For example, the first adhesive layer 120*a*** may include an epoxy-based resin and a filler.

In this case, the filler may include at least one of, for example, silica ($SiO_2$), alumina ($Al_2O_3$), silicon carbide (SIC), barium sulfate ($BaSO_4$), talc, clay, mica powders, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and/or calcium zirconate ($CaZrO_3$). In addition, the material of the filler is not limited thereto, and the filler may also include a metal material and/or an organic material.

The first adhesive layer **120*a* may insulate one or more of the semiconductor chips 120_1 to 120_6 from the other. In addition, the first adhesive layer 120*a* may insulate, for example, any one of the semiconductor chips 120_1 to 120_6 from the substrate 100**.

Sidewalls of the respective semiconductor chips 120_1 to 120_6 included in the first semiconductor chip stack 120 may be substantially aligned with each other. For example, a sidewall of the first first semiconductor chip 120_1 of the semiconductor chips 120_1 to 120_6 may be disposed on the same line as a sidewall of a second first semiconductor chip 120_2 in the third direction Z.

The second semiconductor chip stack 140 may be formed in the second area A2 where the first semiconductor chip stack 120 is not disposed. The second semiconductor chip stack 140 may include a plurality of semiconductor chips 140_1 to 140_4. For example, the second semiconductor chip stack 140 may have a form in which the plurality of semiconductor chips (e.g., 140_1 to 140_4) are stacked on each other in the third direction Z.

The semiconductor chips 140_1 to 140_4 included in the second semiconductor chip stack 140 may be stacked in a stepped shape. For example, a first semiconductor chip 140_1 of the semiconductor chips 140_1 to 140_4 may be stacked in state in which it is spaced apart from a second semiconductor chip 140_2 by a predetermined distance in the first direction X or the second direction Y. For example, the first semiconductor chip 140_1 may be misaligned with the second semiconductor chip 140_2. In addition, a third semiconductor chip 140_3 of the semiconductor chips 140_1 to 140_4 may be stacked in state in which it is spaced apart from a fourth semiconductor chip 140_4 by a predetermined distance in the first direction X or the second direction Y. For example, the third semiconductor chip 140_3 may be misaligned with the fourth semiconductor chip 140_4.

The semiconductor chips 140_1 to 140_4 included in the second semiconductor chip stack 140 may be stacked in a zigzag pattern. The first and second semiconductor chips 140_1 and 140_2 and the third and fourth semiconductor chips 140_3 and 140_4 might not be aligned with each other in the third direction Z. For example, the first and second semiconductor chips 140_1 and 140_2 may be alternately disposed, and the third and fourth semiconductor chips 140_3 and 140_4 may be alternately disposed.

In this case, the first and third semiconductor chips 140_1 and 140_3 included in the second semiconductor chip stack 140 may aligned with each other in the third direction Z, and the second and fourth semiconductor chips 140_2 and 140_4 included in the second semiconductor chip stack 140 may be aligned with each other in the third direction Z.

The semiconductor chips 140_1 to 140_4 may include memory chips. The semiconductor chips 140_1 to 140_4 may include, for example, non-volatile memory chips such as NAND flash memories.

The second semiconductor chip pad 162 may be disposed on each of the semiconductor chips 140_1 to 140_4. For example, the second semiconductor chip pad 162 may be disposed on an upper surface of each of the semiconductor chips 140_1 to 140_4. The second semiconductor chip pad 162 may be exposed on the other corner (e.g., a right corner) of the upper surface of each of the semiconductor chips 140_1 to 140_4; however, the present inventive concept is not limited thereto A plurality of second semiconductor chip pads 162 may be formed.

The second semiconductor chip pad 162 may include, for example, at least one of copper (Cu), aluminum (Al), tungsten (W), and/or titanium (Ti).

A second adhesive layer **140*a* may be disposed between the respective semiconductor chips 140_1 to 140_4 and between the lowermost semiconductor chip 140_1 and a second spacer 190 that is to be described later. In addition, the second adhesive layer 140*a* may be disposed between the second spacer 190 and the controller 180 and between the controller 180 and the substrate 100**.

The second adhesive layer **140*a* may be, for example, a direct adhesive film (DAF). The second adhesive layer 140*a* may include, for example, an insulating polymer. The description of the first adhesive layer 120*a* described above may be similarly applied to a description of a material of the second adhesive layer 140*a***.

The second adhesive layer **140*a* may insulate one or more of the semiconductor chips 140_1 to 140_4 from the other. In addition, the second adhesive layer 140*a* may increase reliability with the second semiconductor chip stack 140 by firmly attaching the lowermost semiconductor chip 140_1 and the second spacer 190** to each other.

The first spacer 130 may be disposed on the first semiconductor chip stack 120. The first spacer 130 may be disposed on the uppermost semiconductor chip 120_6.

An upper surface of the first spacer 130 and an upper surface of the second semiconductor chip stack 140 may be disposed on the same plane in the third direction Z. The first spacer 130 might not be disposed on the second semiconductor chip stack 140.

The first spacer 130 may include a silicon layer 132 and a coupling layer 131 disposed on the silicon layer 132. The coupling layer 131 may be formed on the first spacer 130. For example, the coupling layer 131 may be formed on the upper surface of the first spacer 130. For example, a thickness TS1 of the first spacer 130, on which the coupling layer 131 is formed, may be about 50 μm to about 300 μm, but the present inventive concept is not limited thereto.

The coupling layer 131 may include a material that chemically couples a mold layer 170 and a silicon layer 132, which is to be described later, to each other. For example, the coupling layer 131 may be a silane coupling agent. The silicon layer 132 may include, for example, silicon (Si).

For example, the silane coupling agent may include at least one of 2-(3, 4 epoxycyclohexyl) ethyltrimethoxysilane, 3-Glycidoxypropyl methyldimethoxysilane, 3-Glycidoxypropyl trimethoxysilane, 3-Glycidoxypropyl methyldiethoxysilane, and/or 3-Glycidoxypropyl triethoxysilane, but the present inventive concept is not limited thereto.

The mold layer 170 may cover the first semiconductor chip stack 120, the second semiconductor chip stack 140, and the first spacer 130. For example, the mold layer 170 may integrally cover the first semiconductor chip stack 120, the second semiconductor chip stack 140, and the first spacer 130. For example, the mold layer 170 may be disposed on the upper surface of the first spacer 130 and the upper surface of the second semiconductor chip stack 140. For example, the mold layer 170 may be in contact with each of the upper surface of the first spacer 130 and the upper surface of the second semiconductor chip stack 140.

The mold layer 170 may include an insulating material. For example, the mold layer 170 may include a thermosetting resin such as epoxy resin or a thermoplastic resin such as polyimide. In addition, for example, the mold layer 170 may include a molding material such as epoxy molding compound (EMC).

As the coupling layer 131 including the silane coupling agent is formed on the surface of the first spacer 130, adhesion between the first spacer 130 and the mold layer 170 may be increased. Accordingly, it is possible to prevent interface separation between the first semiconductor chip stack 120 and the mold layer 170.

The controller 180 may be disposed between the substrate 100 and the second semiconductor chip stack 140. The third upper pad 112_3 may be electrically connected to the controller 180. The controller 180 may be, for example, a logic chip that controls a memory chip.

The second spacer 190 may be disposed between the controller 180 and the second semiconductor chip stack 140. The second spacer 190 may be disposed on a lower side of the lowermost semiconductor chip 140_1. The second spacer 190 may include, for example, silicon (Si). The second spacer 190 may be used to reduce warpage between the second semiconductor chip stack 140 and the controller 180.

A plurality of external connection terminals 200 may be formed on a lower side of the substrate 100. The external connection terminal 200 may be disposed to be electrically connected to the substrate 100. The external connection terminal 200 may be in contact with, for example, the lower wiring pad 111.

The external connection terminal 200 may electrically connect a semiconductor package including the substrate 100 to another semiconductor package. In addition, the external connection terminal 200 may electrically connect the semiconductor package including the substrate 100 to another semiconductor element.

In the drawing, the external connection terminal 200 is illustrated as being a solder ball, but the present inventive concept is not limited thereto. For example, the external connection terminal 200 may be a solder bump, a grid array, or a conductive tab.

Figure 3:
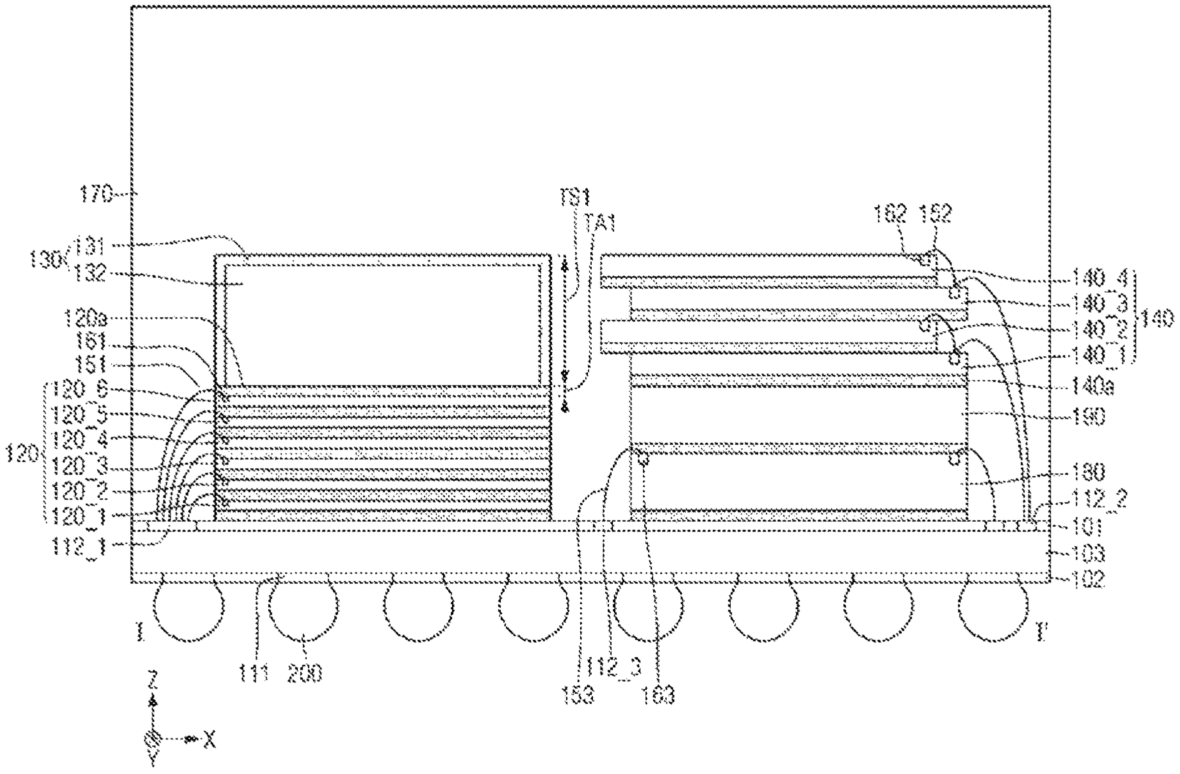
FIG. 3 is a view illustrating a semiconductor package according to an exemplary embodiment of the present inventive concept.

FIG. 3 is a view illustrating a semiconductor package according to an exemplary embodiment of the present inventive concept. For reference, FIG. 3 is a cross-sectional view corresponding to FIG. 2. For convenience of description, descriptions of the same contents as those described with reference to FIGS. 1 and 2 may be omitted or briefly discussed.

Referring to FIG. 3, the coupling layer 131 of the first spacer 130 may be formed on a side surface of the silicon layer 132 of the first spacer 130 as well as the upper surface thereof. In this case, the side surface of the first spacer 130 and the mold layer 170 may be in contact with each other. For example, a side surface of the coupling layer 131 may be in contact with the mold layer 170, and the side surface of the coupling layer 131 may be disposed between the side surface of the silicon layer 132 and the mold layer 170.

Figure 4:
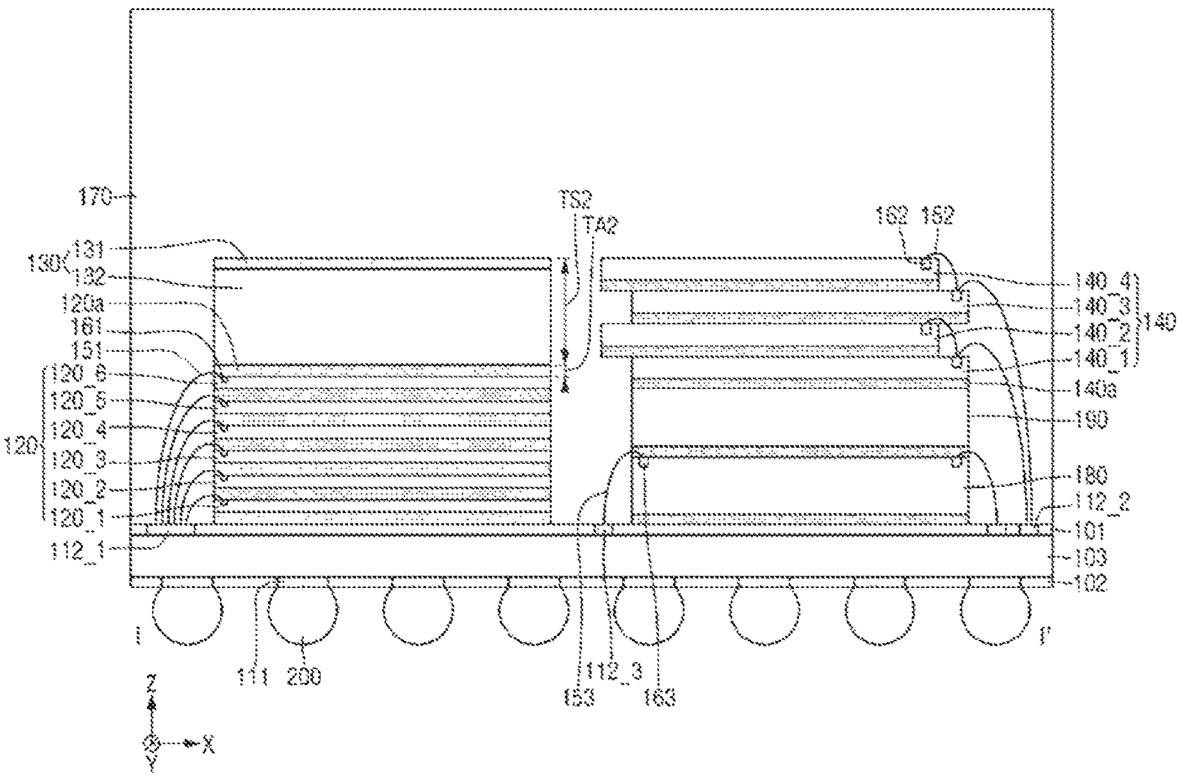
FIG. 4 is a view illustrating a semiconductor package according to an exemplary embodiment of the present inventive concept.

FIG. 4 is a view illustrating a semiconductor package according to an exemplary embodiment of the present inventive concept. For reference, FIG. 4 is a cross-sectional view corresponding to FIG. 2. For convenience of description, descriptions of the same contents as those described with reference to FIGS. 1 to 3 may be omitted or briefly discussed.

Referring to FIG. 4, based on the third direction Z, a thickness TA2 of a first adhesive layer **120*a* may be greater than a thickness TA1 of the first adhesive layer 120*a* of FIG. 2. Accordingly, based on the third direction Z, a thickness TS2 of a first spacer 130 may be smaller than a thickness TS1 of the first spacer 130 of FIG. 2**.

In addition, even in this case, a height of the upper surface of the first spacer 130 and a height of the upper surface of the second semiconductor chip stack 140 may be substantially equal to each other.

Figure 5:
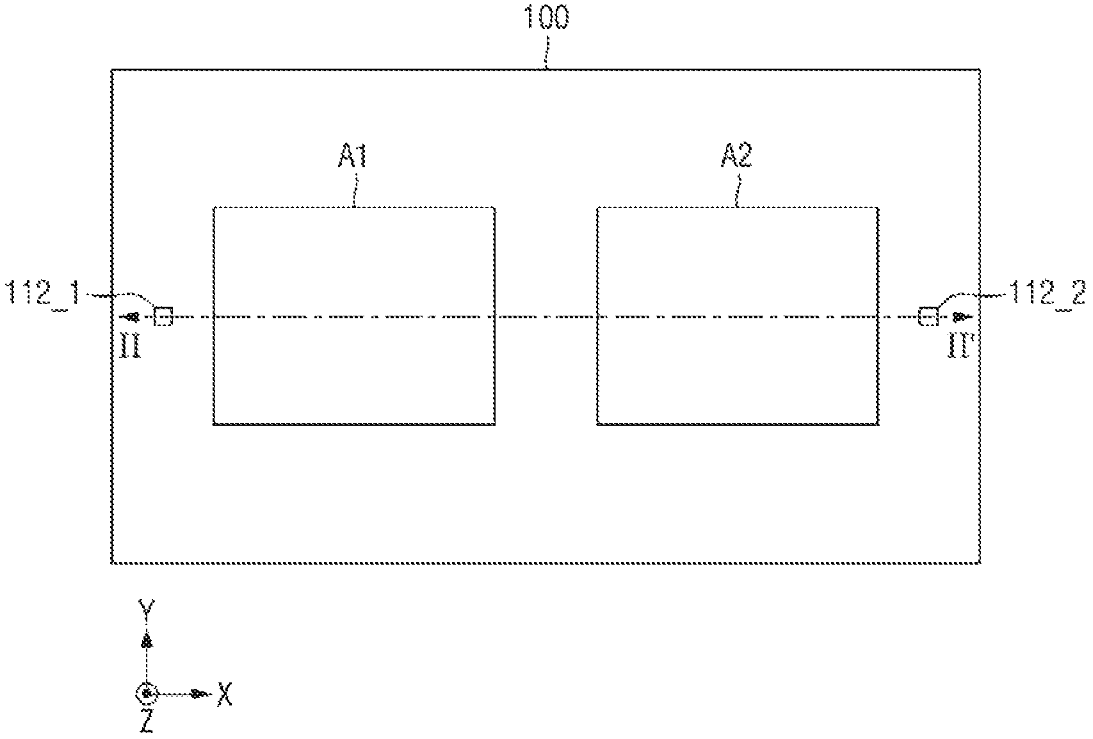
FIG. 5 is a plan view illustrating a semiconductor package according to an exemplary embodiment of the present inventive concept.
Figure 6:
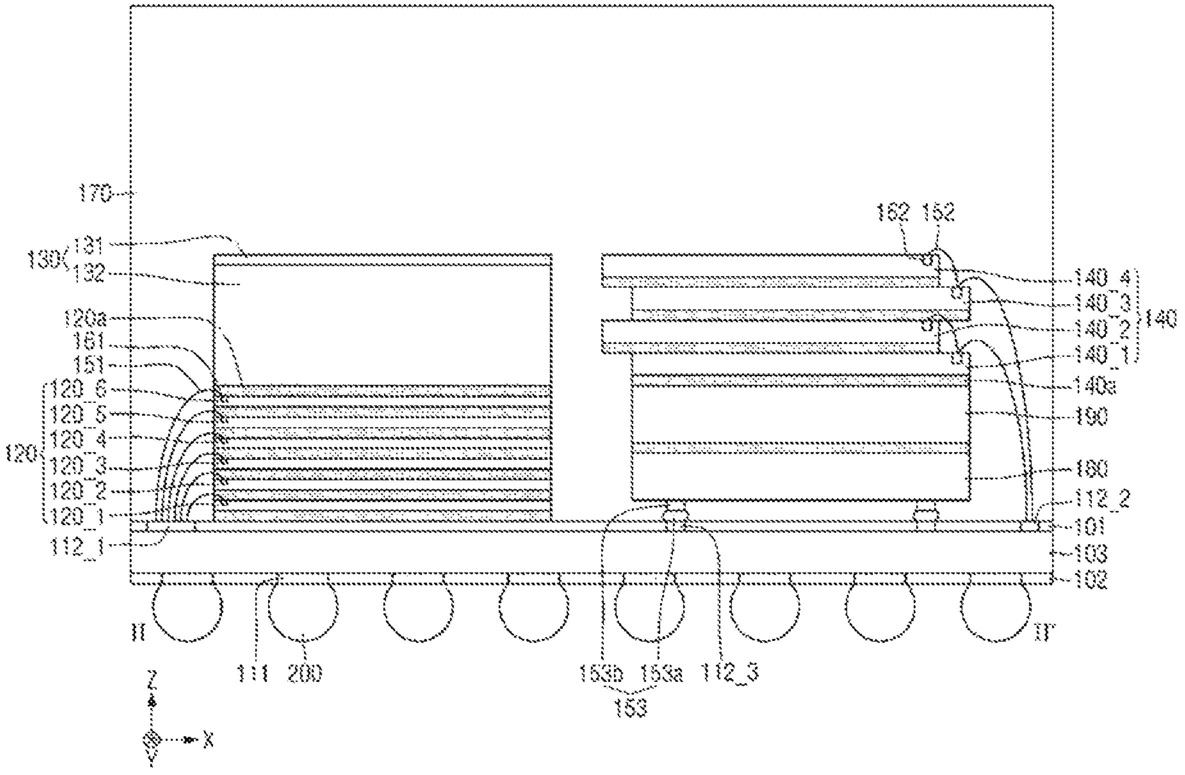
FIG. 6 is a cross-sectional view taken along line II-II' of FIG. 5.

FIG. 5 is a plan view illustrating a semiconductor package according to an exemplary embodiment of the present inventive concept. FIG. 6 is a cross-sectional view taken along line II-II' of FIG. 5. For convenience of description, descriptions of the same contents as those described with reference to FIGS. 1 and 4 may be omitted or briefly discussed.

Referring to FIGS. 5 and 6, the controller 180 may be mounted on the substrate 100 in a flip chip method.

The controller 180 may be electrically connected to the substrate 100 through a solder ball **153*a* that is connected to the third upper pad 112_3. For example, the third upper pad 112_3 may be connected to the controller 180, which is on the substrate 100, through the third connection portion 153 that includes the solder ball 153*a* and a connection pad 153*b***.

Figure 7:
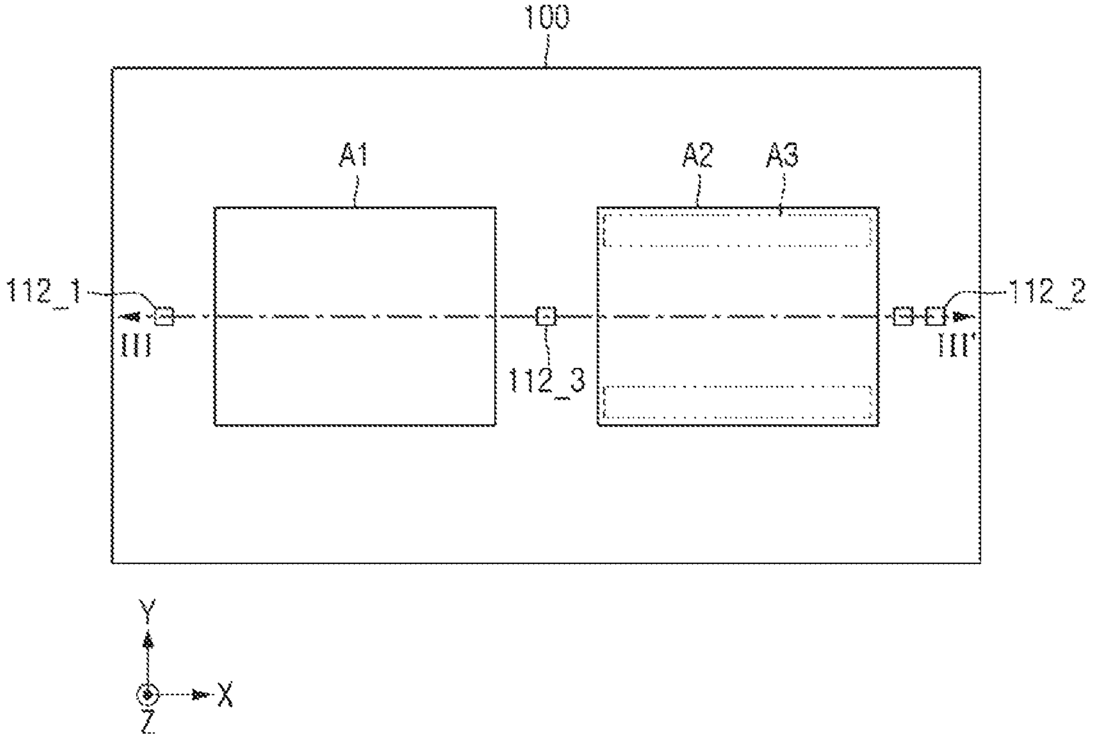
FIG. 7 is a plan view illustrating a semiconductor package according to an exemplary embodiment of the present inventive concept.
Figure 8:
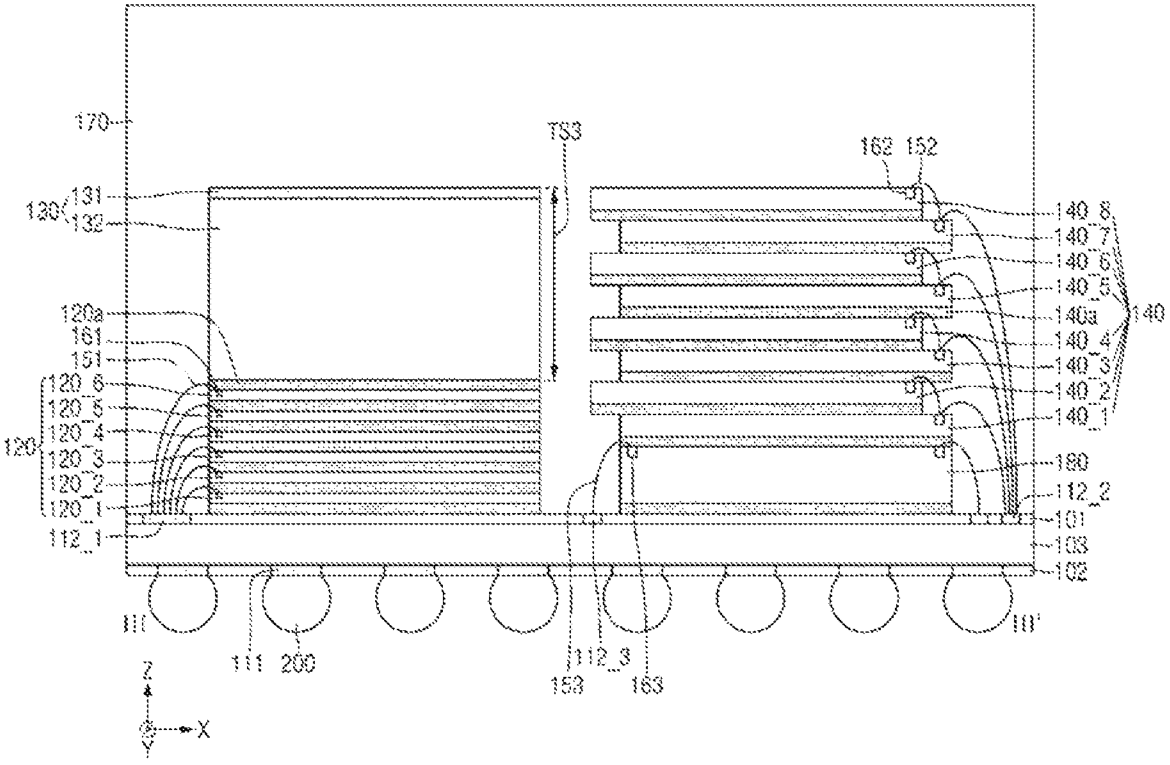
FIG. 8 is a cross-sectional view taken along line III-III' of FIG. 7.

FIG. 7 is a plan view illustrating a semiconductor package according to an exemplary embodiment of the present inventive concept. FIG. 8 is a cross-sectional view taken along line III-III' of FIG. 7. For convenience of description, descriptions of the same contents as those described with reference to FIGS. 1 to 6 may be omitted or briefly discussed.

Referring to FIGS. 7 and 8, the second spacers 190 may be disposed to be spaced apart from each other in the second direction Y in the third area A3 that at least partially overlaps the second area A2. In this case, a plurality of second spacers 190 may be formed.

In addition, unlike FIGS. 1 to 6, the second semiconductor chip stack 140 may include 8 semiconductor chips 140_1 to 140_8 instead of the 4 semiconductor chips illustrated in FIGS. 1 to 6. Accordingly, based on the third direction Z, a thickness TS3 of a first spacer 130 may be greater than the thickness TS1 of the first spacer 130 of FIG. 2.

Figure 9:
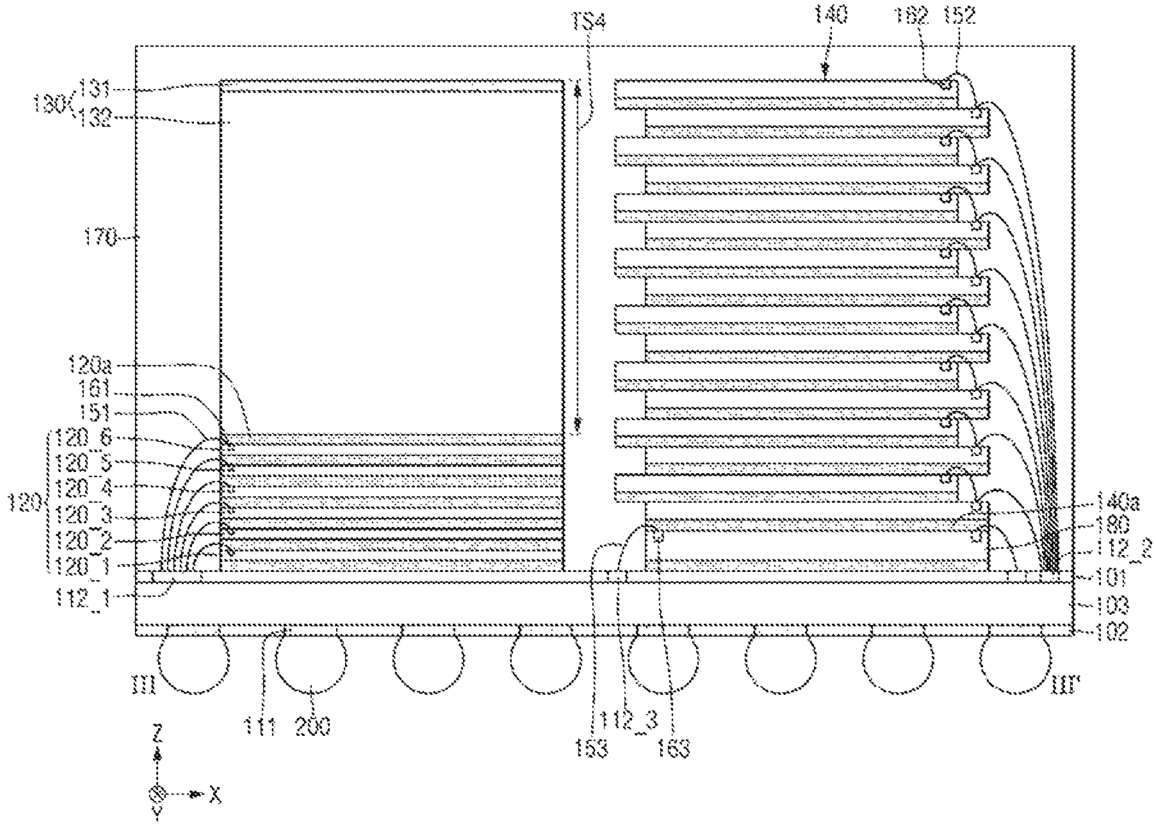
FIG. 9 is a view illustrating a semiconductor package according to an exemplary embodiment of the present inventive concept.

FIG. 9 is a view illustrating a semiconductor package according to an exemplary embodiment of the present inventive concept. For convenience of description, descriptions of the same contents as those described with reference to FIGS. 1 to 8 may be omitted or briefly discussed.

Referring to FIG. 9, unlike FIGS. 1 to 6, the second semiconductor chip stack 140 may include 16 semiconductor chips instead of the 4 semiconductor chips illustrated in FIGS. 1 to 6. Accordingly, based on the third direction Z, a thickness TS4 of a first spacer 130 may be greater than each of the thickness TS1 of the first spacer 130 of FIG. 2 and the thickness TS3 of the first spacer 130 of FIG. 8.

Figure 10:
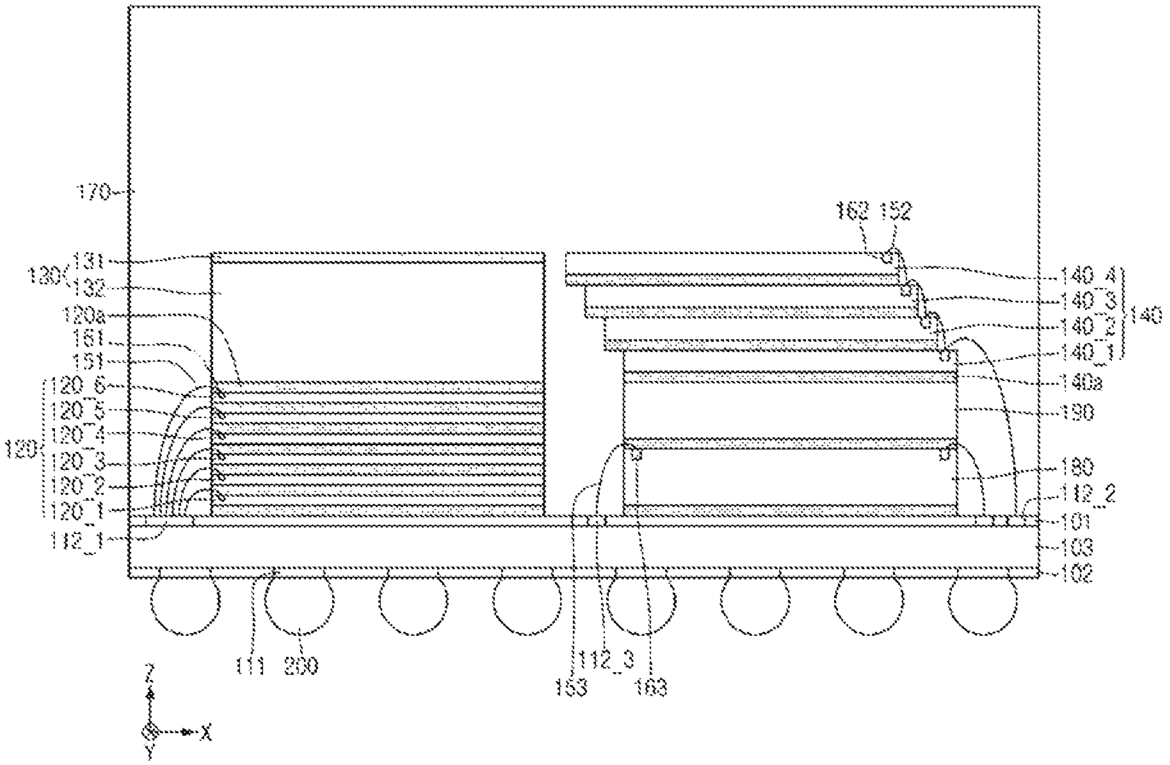
FIG. 10 is a view illustrating a semiconductor package according to an exemplary embodiment of the present inventive concept.
Figure 11:
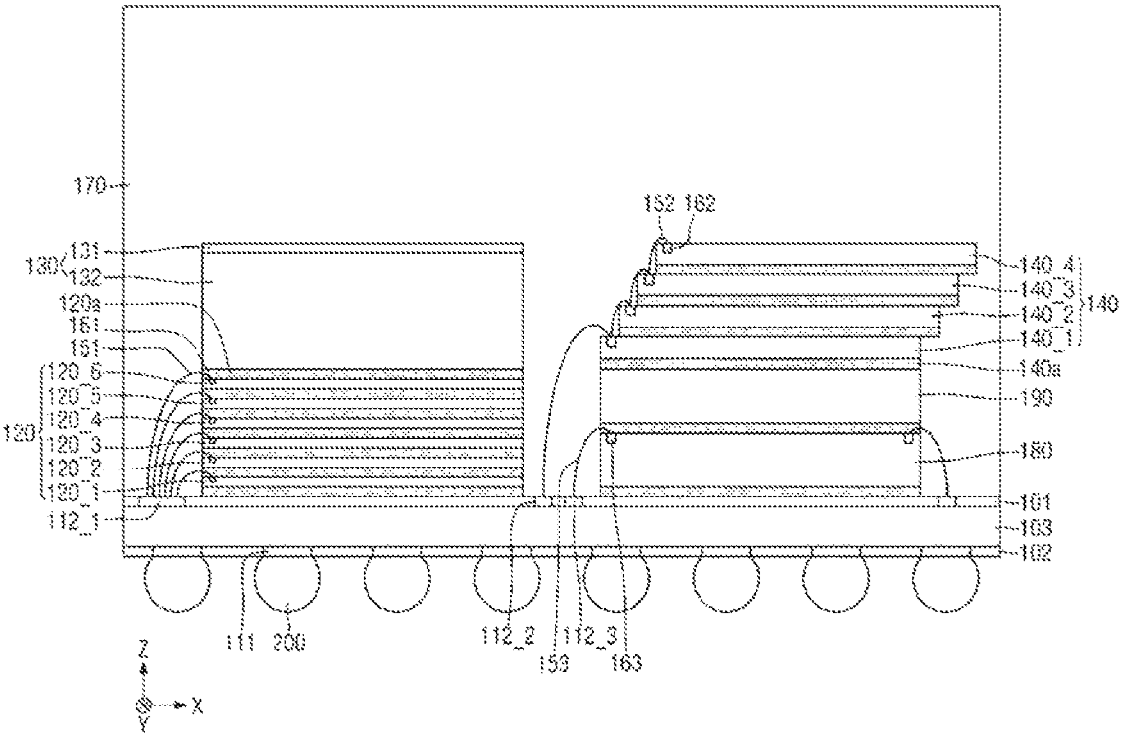
FIG. 11 is a view illustrating a semiconductor package according to an exemplary embodiment of the present inventive concept.

FIG. 10 is a view illustrating a semiconductor package according to an exemplary embodiment of the present inventive concept. FIG. 11 is a view illustrating a semiconductor package according to an exemplary embodiment of the present inventive concept. For convenience of description, descriptions of the same contents as those described with reference to FIGS. 1 and 9 may be omitted or briefly discussed.

Referring to FIG. 10, the first to fourth semiconductor chips 140_1 to 140_4 included in the second semiconductor chip stack 140 may be stacked to form a stepped shape (e.g., a staircase shape). For example, the first semiconductor chip 140_1 of the first to fourth semiconductor chips 140_1 to 140_4 may be stacked in state in which it is spaced apart from the second semiconductor chip 140_2 thereof by a predetermined distance in a specific direction. For example, the semiconductor chips 140_1 to 140_4 included in the second semiconductor chip stack 140 may be sequentially offset-aligned. The specific direction may be, for example, the first direction X and/or the second direction Y.

As the semiconductor chips 140_1 to 140_4 included in the second semiconductor chip stack 140 are stacked in the stepped shape, the second semiconductor chip pad 162 may be exposed on the other (e.g., a second) corner (e.g., a right corner) of the upper surface of each of the semiconductor chips 140_1 to 140_4. For example, the second semiconductor chip stack 140 may have a stepped structure descending in the first direction X.

Referring to FIG. 11, as the semiconductor chips 140_1 to 140_4 included in the second semiconductor chip stack 140 are stacked in the stepped shape, the second semiconductor chip pad 162 may be exposed on one (e.g., a first) corner (e.g., a left corner) of the upper surface of each of the semiconductor chips 140_1 to 140_4. For example, the second semiconductor chip stack 140 may have a stepped structure descending in a direction opposite to the first direction X.

FIGS. 12 to 15 are intermediate step views illustrating a method of manufacturing a semiconductor package according to an exemplary embodiment of the present inventive concept. For convenience of description, descriptions of the same contents as those described with reference to FIGS. 1 to 11 may be omitted or briefly discussed.

Figure 12:
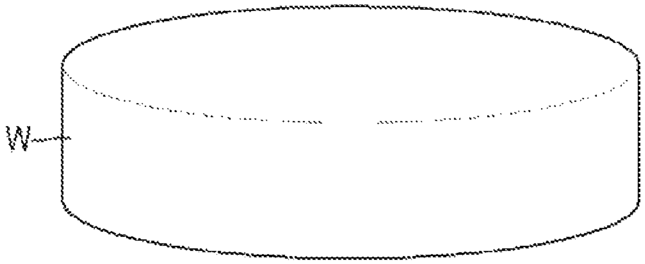
FIGS. 12, 13, 14 and 15 are intermediate step views illustrating a method of manufacturing a semiconductor package according to an exemplary embodiment of the present inventive concept.

Referring to FIG. 12, a wafer W is prepared. The wafer W may be, for example, a bare Si chip.

Figure 13:
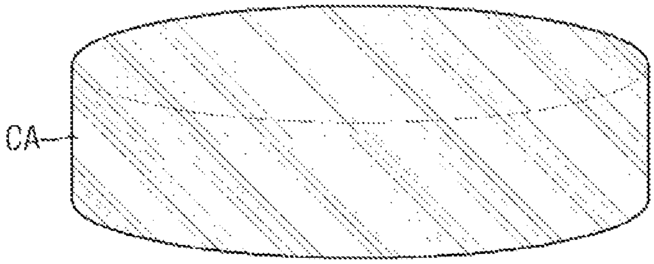

Referring to FIG. 13, a coupling material CA may be deposited on a surface of the wafer W. The coupling material CA may be the aforementioned silane coupling agent. The coupling material CA may be deposited on the surface of the wafer W using, for example, a physical vapor deposition (PVD) or chemical vapor deposition (CVD) process.

Figure 14:
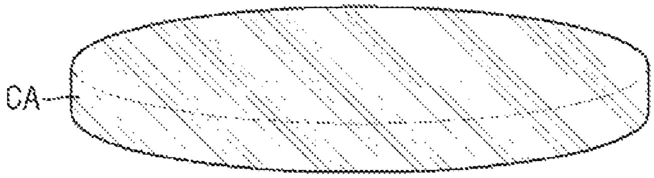

Referring to FIG. 14, at least a portion of the wafer W, on which the coupling material CA is formed, may be removed to reduce a thickness of the wafer. At least a portion of the wafer W may be removed by using a back lapping process.

Figure 15:
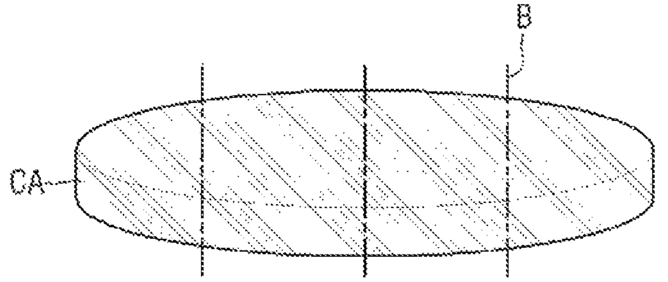

Referring to FIG. 15, the wafer W may be divided into a plurality of pieces. In this case, the wafer W may be divided by using, for example, a cutting blade B or a laser.

Thereafter, the divided wafers W may be stacked on the first semiconductor chip stack 120. Accordingly, the semiconductor package illustrated in FIG. 3 may be formed.

Figure 16:
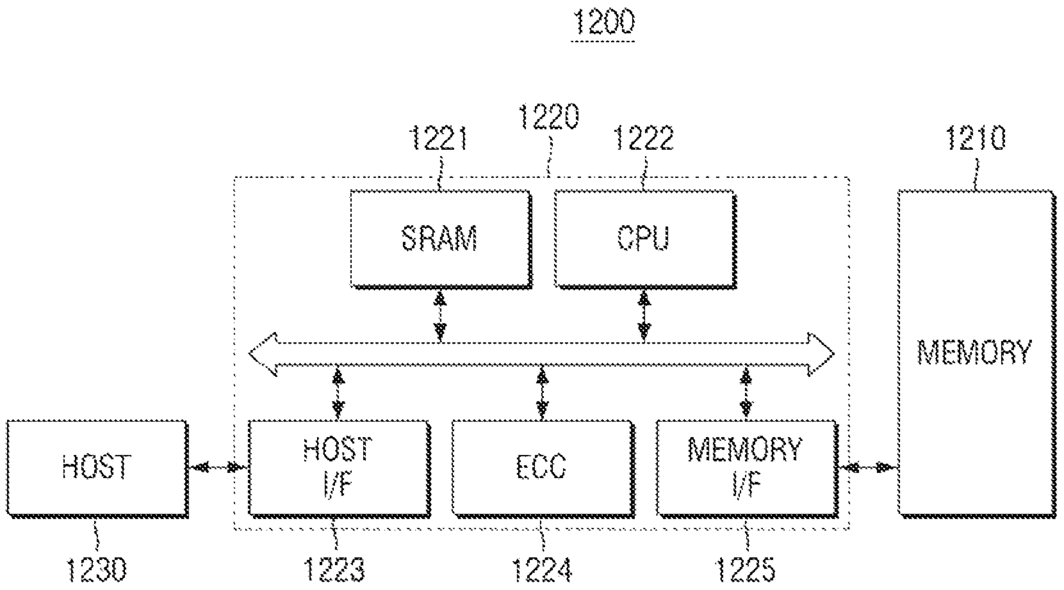
FIG. 16 is a block diagram illustrating a memory card having a semiconductor package according to some exemplary embodiments of the present inventive concept.

FIG. 16 is a block diagram illustrating a memory card having a semiconductor package according to some exemplary embodiments of the present inventive concept.

Referring to FIG. 16, the semiconductor package according to some exemplary embodiments of the present inventive concept may be applied to a memory card 1200.

The memory card 1200 may include a memory controller 1220 that controls data exchange between a host 1230 and a memory 1210. An SRAM 1221 may be used as an operating memory of a central processing unit 1222. A host interface 1223 may have a data exchange protocol of the host 1230 that is connected to the memory card 1200. An error correction code 1224 may detect and correct errors included in data read from the memory 1210. A memory interface 1225 may interface with and enable communication with the memory 1210. The central processing unit 1222 may perform various control operations for data exchange of the memory controller 1220.

For example, at least one of the memory 1210 and/or the central processing unit 1222 may include at least one of the semiconductor packages according to some exemplary embodiments of the present inventive concept.

Figure 17:
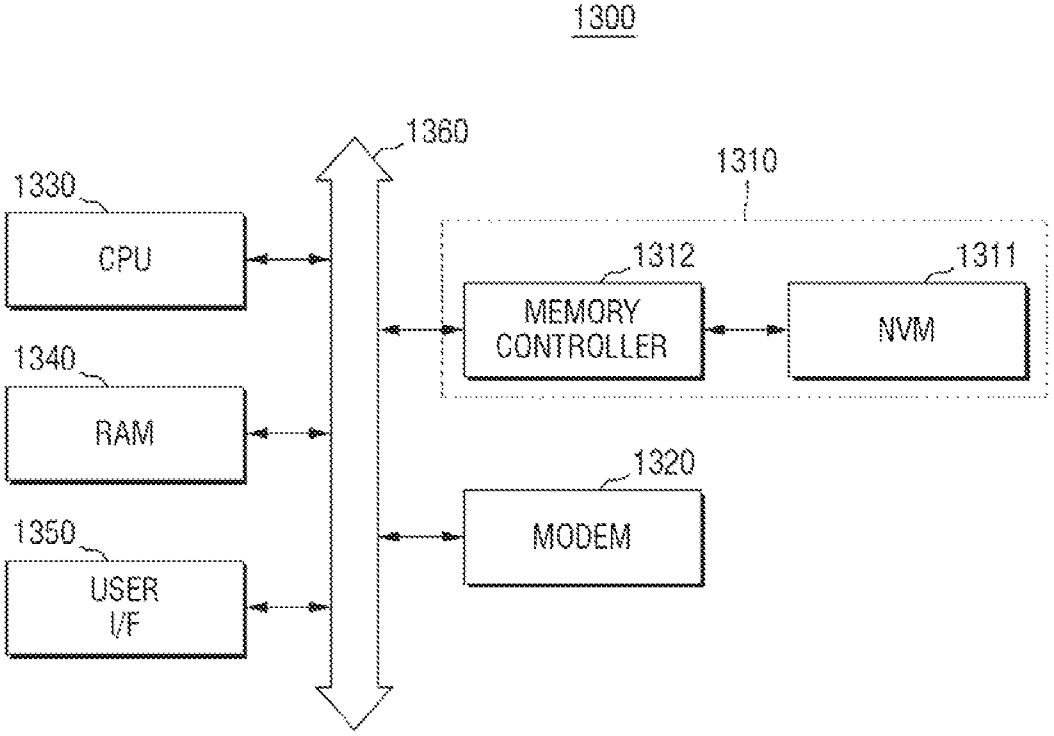
FIG. 17 is a block diagram illustrating an information processing system to which a semiconductor package according to some exemplary embodiments of the present inventive concept is applied.

FIG. 17 is a block diagram illustrating an information processing system to which a semiconductor package according to some exemplary embodiments of the present inventive concept is applied.

Referring to FIG. 17, the semiconductor package according to some exemplary embodiments of the present inventive concept may be applied to an information processing system 1300.

The information processing system 1300 may include, for example, a mobile device or a computer. The information processing system 1300 may include a memory system 1310, a modem 1320, a central processing unit 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 16. In addition, at least one of the central processing unit 1330 and/or the RAM 1340 may include at least one of the semiconductor packages according to some exemplary embodiments of the present inventive concept.

Data processed by the central processing unit 1330 or data input from the outside may be stored in the memory system 1310. The information processing system 1300 may be provided as, for example, a memory card, a solid state disk, a camera image sensor, and other application chipsets. As an example, the memory system 1310 may be configured as a solid state disk (SSD), and in this case, the information processing system 1300 may stably and reliably store large amounts of data in the memory system 1310.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor package comprising:

a substrate extending in first and second directions that intersect each other;

a first semiconductor chip stack disposed on the substrate and including a plurality of first semiconductor chips stacked on each other;

a second semiconductor chip stack disposed on the substrate, and spaced apart from the first semiconductor chip stack in the first direction, wherein the second semiconductor chip stack includes a plurality of second semiconductor chips stacked on each other;

a first spacer disposed on the first semiconductor chip stack and including a coupling layer formed on a side surface and an upper surface of a silicon layer of the first spacer; and a mold layer covering the first and second semiconductor chip stacks and in contact with the first spacer, wherein a side surface of the first spacer and the mold layer are in contact with each other.

2. The semiconductor package of claim 1, wherein an upper surface of the first spacer and an upper surface of the second semiconductor chip stack are disposed on substantially a same plane.

3. The semiconductor package of claim 1, wherein the first spacer is not disposed on the second semiconductor chip stack.

4. The semiconductor package of claim 1, further comprising a controller disposed between the substrate and the second semiconductor chip stack.

5. The semiconductor package of claim 4, further comprising a second spacer disposed between the controller and the second semiconductor chip stack.

6. The semiconductor package of claim 4, wherein the substrate includes:

an insulating structure including an insulating layer and first and second passivation layers disposed on the insulating layer, and a wiring structure including a first wiring layer disposed in the first passivation layer and a second wiring layer disposed in the second passivation layer, and the first wiring layer includes:

a first upper pad electrically connected to the first semiconductor chip stack through a first bonding wire, a second upper pad electrically connected to the second semiconductor chip stack through a second bonding wire, and a third upper pad electrically connected to the controller.

7. The semiconductor package of claim 6, wherein the controller is electrically connected to the substrate through a third bonding wire that is connected to the third upper pad.

8. The semiconductor package of claim 6, wherein the controller is electrically connected to the substrate through a solder ball that is connected to the third upper pad.

9. The semiconductor package of claim 1, wherein the coupling layer includes a silane coupling agent.

10. The semiconductor package of claim 1, wherein the coupling layer includes at least one of 2-(3, 4 epoxycyclohexyl) ethyltrimethoxysilane, 3-Glycidoxypropyl methyldimethoxysilane, 3-Glycidoxypropyl trimethoxysilane, 3-Glycidoxypropyl methyldiethoxysilane, or 3-Glycidoxypropyl triethoxysilane.

11. The semiconductor package of claim 1, wherein the silicon layer includes silicon (Si), and the mold layer includes an insulating material.

12. A semiconductor package comprising:

a substrate including a first area and a second area spaced apart from the first area;

a first semiconductor chip stack disposed in the first area and including a plurality of first semiconductor chips stacked on each other;

a second semiconductor chip stack disposed in the second area and including a plurality of second semiconductor chips stacked on each other;

a first spacer disposed on the first semiconductor chip stack in the first area and including a silicon layer and a coupling layer disposed on the silicon layer, wherein the coupling layer is chemically coupled to the silicon layer and a mold layer; and the mold layer in contact with a first surface of the first spacer and a first surface of the second semiconductor chip stack.

13. The semiconductor package of claim 12, wherein the first surface of the first spacer and the first surface of the second semiconductor chip stack are disposed on substantially a same plane.

14. The semiconductor package of claim 12, further comprising a controller disposed between the substrate and the second semiconductor chip stack.

15. The semiconductor package of claim 14, wherein the controller is mounted on the substrate by a wire bonding method.

16. The semiconductor package of claim 14, wherein the controller is mounted on the substrate by a flip chip method.

17. The semiconductor package of claim 12, further comprising a second spacer disposed in the second area and including a silicon layer.

18. A semiconductor package comprising:

a substrate extending in first and second directions that intersect each other;

a first semiconductor chip stack disposed on the substrate and including a plurality of first semiconductor chips stacked on each other;

a second semiconductor chip stack disposed on the substrate, and spaced apart from the first semiconductor chip stack in the first direction, wherein the second semiconductor chip stack includes a plurality of second semiconductor chips stacked on each other;

a first spacer disposed on the first semiconductor chip stack and having a silane coupling agent, wherein the silane coupling agent is chemically coupled to a silicon layer of the first spacer and a mold layer;

the mold layer covering the first and second semiconductor chip stacks;

a controller disposed between the substrate and the second semiconductor chip stack; and a second spacer disposed between the controller and the second semiconductor chip stack.

19. The semiconductor package of claim 18, wherein an upper surface of the first spacer and an upper surface of the second semiconductor chip stack are in contact with the mold layer.

20. The semiconductor package of claim 19, wherein the upper surface of the first spacer and the upper surface of the second semiconductor chip stack are disposed on substantially a same plane.

* * * * *